(12) United States Patent
Kang et al.

(10) Patent No.: US 8,324,003 B2
(45) Date of Patent: Dec. 4, 2012

(54) METHOD FOR MANUFACTURING A THIN FILM TRANSISTOR ARRAY PANEL

(75) Inventors: Hoon Kang, Suwon-si (KR); Jin-Ho Ju, Seoul (KR); Yang-Ho Jung, Yongin-si (KR); Jae-Sung Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 196 days.

(21) Appl. No.: 12/767,667

(22) Filed: Apr. 26, 2010

(65) Prior Publication Data

US 2011/0177639 A1 Jul. 21, 2011

(30) Foreign Application Priority Data

Jan. 19, 2010 (KR) .................. 10-2010-0004929

(51) Int. Cl.
*H01L 21/311* (2006.01)
*H01L 33/44* (2010.01)

(52) U.S. Cl. .......... 438/34; 438/151; 438/637; 438/945; 438/958; 257/E21.24; 257/E21.577

(58) Field of Classification Search ............... 438/29, 438/151, 945, 34, 958, 637; 257/E21.24, 257/E21.577
See application file for complete search history.

(56) References Cited

U.S. PATENT DOCUMENTS

| 7,535,540 B2 * | 5/2009 | SangChul et al. ............ 349/155 |
| 7,688,417 B2 * | 3/2010 | Kim et al. ..................... 349/158 |
| 8,092,981 B2 * | 1/2012 | Kang et al. .................. 430/285.1 |
| 2008/0073644 A1 | 3/2008 | Kong et al. |

FOREIGN PATENT DOCUMENTS

| JP | 11-072802 | | 3/1999 |
| JP | 2003-330045 | | 11/2003 |
| KR | 2002057088 A | * | 7/2002 |
| KR | 10-2005-0014057 A | | 2/2005 |
| KR | 10-2005-0024947 A | | 3/2005 |
| KR | 100508034 B1 | | 8/2005 |
| KR | 100623975 B1 | | 9/2006 |
| KR | 100853207 B1 | | 8/2008 |

* cited by examiner

*Primary Examiner* — Zandra Smith
*Assistant Examiner* — Toniae Thomas
(74) *Attorney, Agent, or Firm* — Innovation Counsel LLP

(57) ABSTRACT

A thin film transistor display panel includes gate wiring formed on an insulation substrate and including gate lines, and gate electrodes and gate pads connected to the gate lines; a gate insulation layer covering the gate wiring; a semiconductor pattern formed over the gate insulation layer; data wiring formed over the gate insulation layer or the semiconductor pattern and including source electrodes, drain electrodes, and data pads; a protection layer including a Nega-PR type of organic insulating layer formed all over the semiconductor pattern and the data wiring, wherein the thickness of the Nega-PR type of organic insulating layer in both the gate and data pad regions is smaller than in the other regions; and a pixel electrode connected to the drain electrode. When exposing the Nega-PR type of passivation layer in the pad region during a photolithography process, a photomask having a lattice pattern made of a metal such as Cr that has a line width of less than the resolution of a light exposer is used. Thus, the resulting post-etch height of the passivation layer can be selectively controlled so as to provide reduced effective thickness in the pad regions.

24 Claims, 9 Drawing Sheets

METHOD FOR MANUFACTURING A THIN FILM TRANSISTOR ARRAY PANEL

CROSS-REFERENCE TO RELATED APPLICATION

This application claims priority to and the benefit of Korean Patent Application No. 10-2010-0004929 filed in the Korean Intellectual Property Office on Jan. 19, 2010, the entire contents of which are incorporated herein by reference.

BACKGROUND OF THE INVENTION

1. Field of the Invention

The present description relates to a method for manufacturing a thin film transistor array panel. More particularly, the present description relates to a manufacturing method of a thin film transistor array panel to enhance adhesive strength between a pad area and an output terminal of a tape automated bonding (TAB) driving integrated circuit.

2. Description of the Related Art

In general, a liquid crystal display device displays an image by adjusting transmittance of a liquid crystal material using an electric field. For this purpose, the liquid crystal display device includes a liquid crystal display panel in which liquid crystal cells are arranged in a matrix pattern, and a driving circuit for driving the liquid crystal display panel.

The liquid crystal display panel includes the thin film transistor display panel and a color filter display panel facing each other, a spacer located for fixedly maintaining a cell gap between the two panels, and a liquid crystal injected into the cell gap.

The thin film transistor (TFT) display panel includes signal lines such as gate wires and data wires, and also has transparent pixel electrodes formed thereon (e.g., made of ITO). The signal lines extend to the edge of connection pads where the latter are disposed in the periphery of non-display areas of the TFT display panel and where the edge connection pads are used for connection with external circuitry such as with gate line driver ICs and data line driver ICs. An insulating layer is formed between the signal lines and pixel electrode regions for defining sufficient insulation therebetween.

The insulating layer may be made of a silicon nitride (SiNx), and is deposited on the signal lines through chemical vapor deposition (CVD). If the signal lines are disposed too close to the pixel electrodes, excessive crosstalk may be generated, and this crosstalk may be due to the silicon nitride between the signal lines and the pixel electrodes being too thin and thus tending to function as a signal coupling dielectric material such that an excessively large capacitance is formed therebetween.

To reduce or prevent the crosstalk, the thickness of the silicon nitride (the distance between the signal line and the pixel electrode) is often substantially supplemented to thereby decrease the capacitance. However it is difficult to thicken the insulation by depositing more silicon nitride with a desired thickness through chemical vapor deposition because it takes a long time. Accordingly, to solve this problem, a method in which an organic layer is thickly coated on the signal lines through a coating method has been proposed.

When the gate wire, the gate insulating layer, an active layer, the data wire, and a data insulating layer are formed, and the organic layer is formed on the data insulating layer in the thin film transistor array panel, if the thickness of the organic layer at the contact pad portions of the TFT panel is relatively large such that the contact pads are recessed deep under the top of the organic layer due to the increased thickness of the organic layer, then conductive balls or other like means that are used for resiliently contacting with the pad and thereby connecting it with external circuits such as ICs are pushed up relative to the recessed contact pads such that increased contact resistance may occur between the external circuit and the pad, and as a result, a signal transfer deterioration may develop.

SUMMARY OF THE INVENTION

Accordingly, the present invention is directed to a manufacturing method of a thin film transistor display panel that substantially solves one or more of the problems due to limitations and disadvantages of the related art.

An advantage of an embodiment of the present invention is to form an organic layer of a pad area to have a thinner thickness than that of a display area.

The present invention relates to a method for manufacturing a thin film transistor display panel, and in detail, for forming the organic layer of the pad area to have a thinner uniform thickness than that of the organic layer through a partial exposure thereby reducing disconnection of the signal lines due to erosion at the pad area by the exfoliation of the insulating layer such as the organic layer.

In order to achieve these and other advantages of the invention, a manufacturing method of a thin film transistor display panel according to an embodiment of the present invention includes: forming a wire throughout a display area and a pad area on an insulating substrate; depositing a passivation layer covering the display area and the pad area; exposing the passivation layer by using a mask including a metal pattern formed in a direction perpendicular and a direction parallel to the wire in a region corresponding to the pad area; and developing the passivation layer for the thickness of the pad area to be thinner than the thickness of the display area.

The surface of the passivation layer on the pad area may be formed with an uneven mosaic pattern or a minute slit pattern.

The passivation layer may be made of a Nega-PR type of organic layer.

A line width of the metal pattern of the area corresponding to the pad area among the mask may be in the range from 0.7 to 3.0 um.

An interval between metal patterns of the area corresponding to the pad area among the mask may be in the range from 0.7 to 3.0 um.

A manufacturing method of a thin film transistor display panel according to another embodiment of the present invention includes: forming a wire throughout a display area and a pad area on an insulating substrate; depositing a passivation layer covering the display area and the pad area; exposing the passivation layer by using a mask including a metal pattern tilted in a positive direction and a negative direction with respect to the wire by a predetermined angle; and developing the passivation layer for the thickness of the pad area to be thinner than the thickness of the display area.

The surface of the passivation layer on the pad area may be formed with an uneven mosaic pattern or a minute slit pattern tilted at the predetermined angle.

The passivation layer may be made of a Nega-PR type of organic layer.

A line width of the metal pattern of the area corresponding to the pad area among the mask may be in the range from 0.7 to 3.0 um.

An interval between metal patterns of the area corresponding to the pad area among the mask may be in the range from 0.7 to 3.0 um.

The predetermined angle may be 45 degrees.

A manufacturing method of a thin film transistor display panel according to another embodiment of the present invention includes: forming a wire throughout a display area and a pad area on an insulating substrate; depositing a passivation layer covering the display area and the pad area; exposing the passivation layer by using a mask including an island metal pattern alternately formed in a first direction and a second direction with respect to the wire in a region corresponding to the pad area; and developing the passivation layer for the thickness of the pad area to be thinner than the thickness of the display area.

The surface of the passivation layer on the pad area may be formed with an uneven mosaic pattern or a minute slit pattern.

The passivation layer may be made of a Nega-PR type of organic layer.

A width of the island metal pattern of the area corresponding to the pad area among the mask may be in the range from 0.7 to 3.0 um.

An interval between island metal patterns of the area corresponding to the pad area among the mask may be in the range from 0.7 to 3.0 um.

The first direction and the second direction may be tilted in the positive direction or the negative direction with respect to the wire by 45 degrees.

According to the present invention, the photomask for the exposure of the Nega-PR organic layer has mosaic patterns formed in a direction (a first direction and a second direction) perpendicular and parallel to the wire therein in the areas corresponding to the pad area of the panel, wherein the mosaic patterns are formed with a metal pattern such as Cr having a line width of less than the resolution of a light exposer such that patterning light is transmitted through the photomask and to the Nega-PR organic layer with varying degrees of intensity and thus the resulting post-etch height of the organic layer can be selectively controlled so as to provide reduced effective thickness in the region of the pad areas. Accordingly, cohesion between the pad of the wire and the TAB driving integrated circuit may be effectively enhanced, and thereby the manufacturing cost may be further reduced and the manufacturing yield may be improved.

BRIEF DESCRIPTION OF THE DRAWINGS

The above and other advantages of the present invention will become more apparent by describing in detail exemplary embodiments thereof with reference to the accompanying drawings, in which.

DESCRIPTION OF THE EMBODIMENTS

Figure 1:
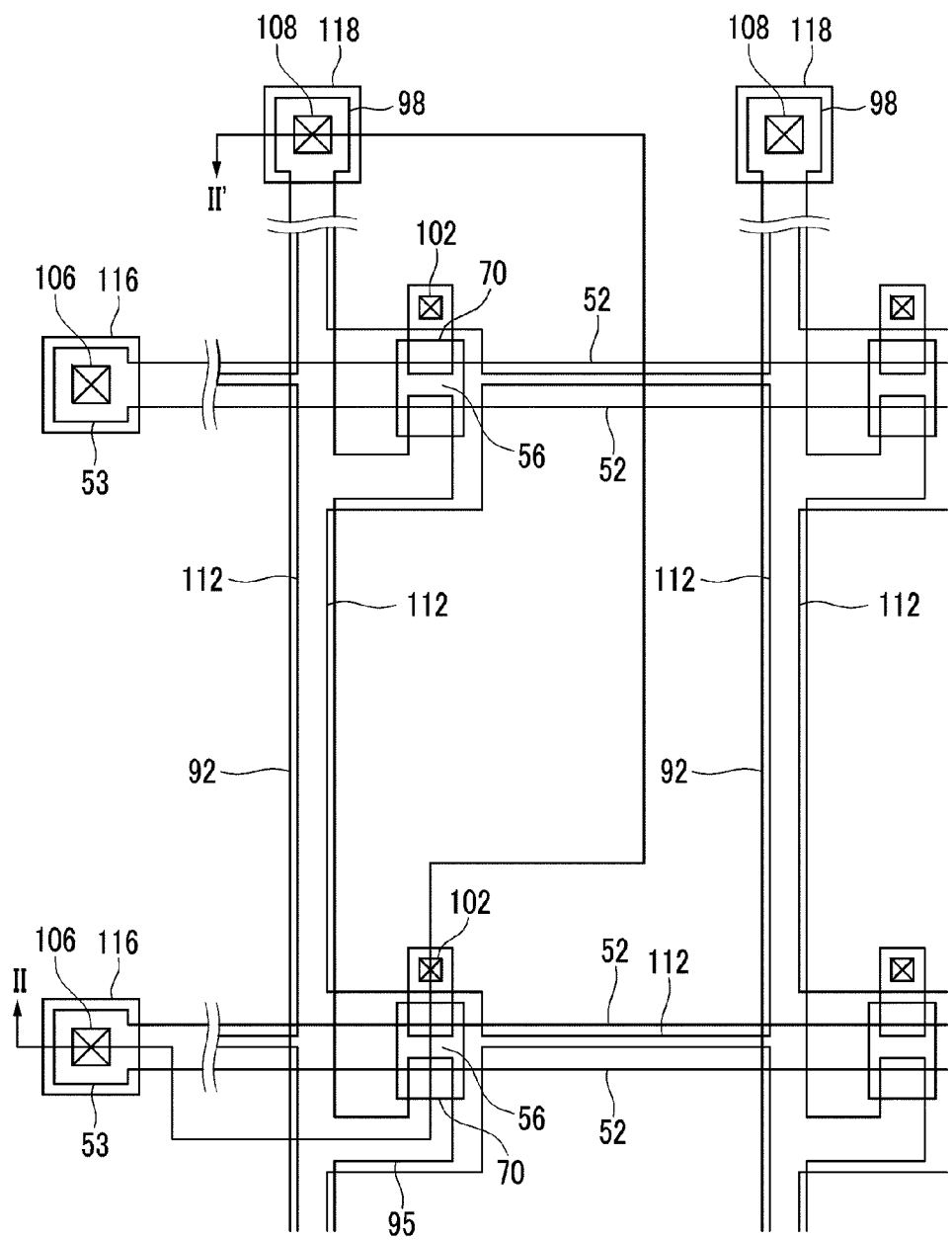
FIG. 1 is a plan view illustrating a thin film transistor display panel according to an embodiment of the present invention.

In the following detailed description, only certain exemplary embodiments of in accordance with the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive, and like reference numerals designate like elements throughout the specification. Detailed descriptions of well-known techniques are omitted.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. On the other hand, when an element is referred to as being "directly on" another element, there are no intervening elements present. Further, it will be understood that when an element such as a layer, film, region, or substrate is referred to as being "under" another element, it can be directly under the other element or intervening elements may also be present. On the other hand, when an element is referred to as being "directly under" another element, there are no intervening elements present.

Hereinafter, the exemplary embodiments of the present invention, particularly the structure of the thin film transistor for the liquid crystal display device, will be described in detail with references to FIGS. 1 and 2.

Figure 2:
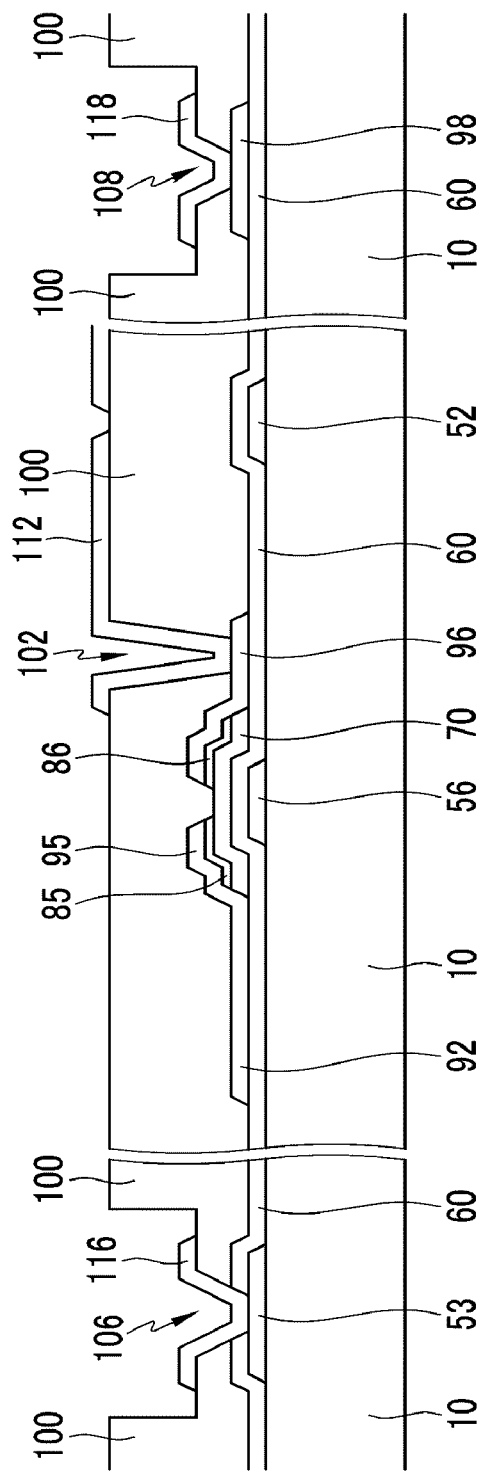
FIG. 2 is a sectional view of the thin film transistor display panel taken along the line II-II' in FIG. 1.

FIG. 1 is a plan view showing a thin film transistor display panel according to an exemplary embodiment of the present invention, and FIG. 2 is the sectional view of the thin film transistor display panel taken along the line II-II' in FIG. 1.

Gate wiring is formed on an insulation substrate 10. The gate wiring is made of an electrically conductive metal such as aluminum (Al) or an aluminum alloy, molybdenum (Mo) or a molybdenum-tungsten (MoW) alloy, chrome (Cr), tantalum (Ta), copper (Cu), or a copper alloy. The gate wiring includes gate lines 52, gate electrodes 56 connected to the gate lines 52, and gate pads 53 connected to ends of the gate lines 52. The gate pads 53 receive gate signals and transmit the gate signals to the gate lines 52. The gate wiring also forms storage capacitors by overlapping with pixel electrodes 112, which will be described later, for improving the charge conservation of the pixel. An additional storage capacitor line may be formed when the storage capacity formed between the gate wiring and the pixel electrode 112 is not sufficient. Although the gate wiring elements 52, 53, and 56 can be made of one of a copper, aluminum, or silver group metal layer having low resistance, a multiple-layered structure such as double or triple layers can also be used.

A gate insulating layer 60 made of a material such as SiNx covers the gate wiring elements 52, 53, and 56. A semiconductor layer 70 made of a semiconductor material such as hydrogenated amorphous silicon is formed over the gate insulating layer 60. Ohmic contact layers 85 and 86 are formed separately over the semiconductor layer 70 with the gate electrode 56 as the center. The ohmic contact layers 85 and 86 are made of a material such as amorphous silicon, microcrystallized silicon, and a metal silicide that is doped with n-type impurities at a high concentration.

A data wire made of a conductive material such as an aluminum, copper, or silver group metal alloy is formed on the ohmic contact layers 85 and 86. The data wire includes a data line 92 extending in the vertical direction, a data pad 98 connected to an end of the data line 92 and transmitting image signals from an external circuit to the data line 92, and a source electrode 95 of a TFT that is a branch of the data line 92. The data wire also includes a plurality of drain electrodes 96 of the TFTs, which are located opposite to the respective source electrodes 95 with respect to the respective gate electrodes 56 and separated from other data wire elements 92, 95, and 98.

The data wire elements 92, 95, 96, and 98 may have a multiple-layered structure like the gate wire elements 52, 53, and 56. Further, when the data wire has a multiple-layered structure, it is preferable that one layer is made of a material having low resistivity and another is made of a material having a good contact characteristic with other materials. When the data pad 98 is formed simultaneously with the gate pad 53, it is preferable to use a single layer material having low resistivity without considering the contact characteristic with different materials.

A passivation layer 100, which may include an inorganic insulating material such as silicon oxide (SiOx) and silicon nitride (SiNx), an organic insulating material having a small dielectric constant such as an acrylic organic compound, benzocyclobutene (BCB), perfluorocyclobutane (PFCB), or the like, and the laminated structure thereof, may be entirely deposited by a deposition technique such as a plasma enhanced chemical vapor deposition (PECVD) technique on the gate insulating layer 60 having the data wire elements 92, 95, 96, and 98 thereon. The organic insulating material has contact holes 102 and 108 exposing the drain electrode and the data pad, and a contact hole 106 exposing the gate pad also through the gate insulating film.

As shown in FIG. 2, the thickness of the organic insulating layer 100 near the gate pad 53 and the data pad 98 is thinner than that of the other areas of the organic insulating layer 100 (hereafter, the portion of the organic insulating layer 100 having the thin thickness is referred to as a gate pad portion and a data pad portion, and a pad portion as a combination thereof). With that small step difference near the gate pad 53 and the data pad 98, it is possible to efficiently transfer the compressive force to an anisotropic conductive film (ACF) during an outer lead bonding (OLB) process.

A plurality of pixel electrodes 112, which receive the data voltage from the thin film transistor and then generate an electric field together with an upper electrode are formed on the passivation layer 100. The pixel electrodes 112 are made of transparent conducting materials such as indium tin oxide (ITO) and indium zinc oxide (IZO), and are physically and electrically connected to the drain electrodes through the contact holes 102 such that the pixel electrodes 112 receive the data voltages from the drain electrodes 96. The pixel electrodes 112 may overlap the gate lines 52 and the data lines 92 to increase the aperture ratio, but this is optional. Gate and data pad contact assistants 116 and 118 cover the contact holes 106 and 108 to be connected to the exposed end portions of the gate pad and the data pad through the contact holes 106 and 108. The gate and data pad contact assistants 116 and 118 protect exposed portions of the contact holes 106 and 108 and complement the adhesion between the exposed portions and external devices, but this is optional.

Therefore, in the thin film transistor display panel according to the present embodiment of the invention, the thickness of the organic insulating layer 100 near the gate pad 53 and the data pad 98 (the pad portion) is thinner than that of other areas of the organic insulating layer 100, so that it is possible to enhance the adhesive strength between the pad regions 53 and 98 and the TAB driving integrated circuit. Also, because the passivation layer 100 having the low dielectric constant formed between the data wiring 92 and the pixel electrode 112, the parasitic capacitance between them is effectively reduced. Improved characteristics of the display device and the widened aperture ratio are possible due to the partial overlapping between the data wiring 92 and the pixel electrode 112. Therefore, according to the present embodiment of the invention, the thickness of the organic insulating layer 100 near the gate pad 53 and the data pad 98 (the pad portion) is thinner than that of the other areas of the organic insulating layer (including the display area) by using the slit or mosaic patterned mask.

Now, a manufacturing method of a TFT array panel having the above-mentioned structure according to an embodiment of the present invention will be described with reference to FIG. 3 to FIG. 5.

Figure 3:
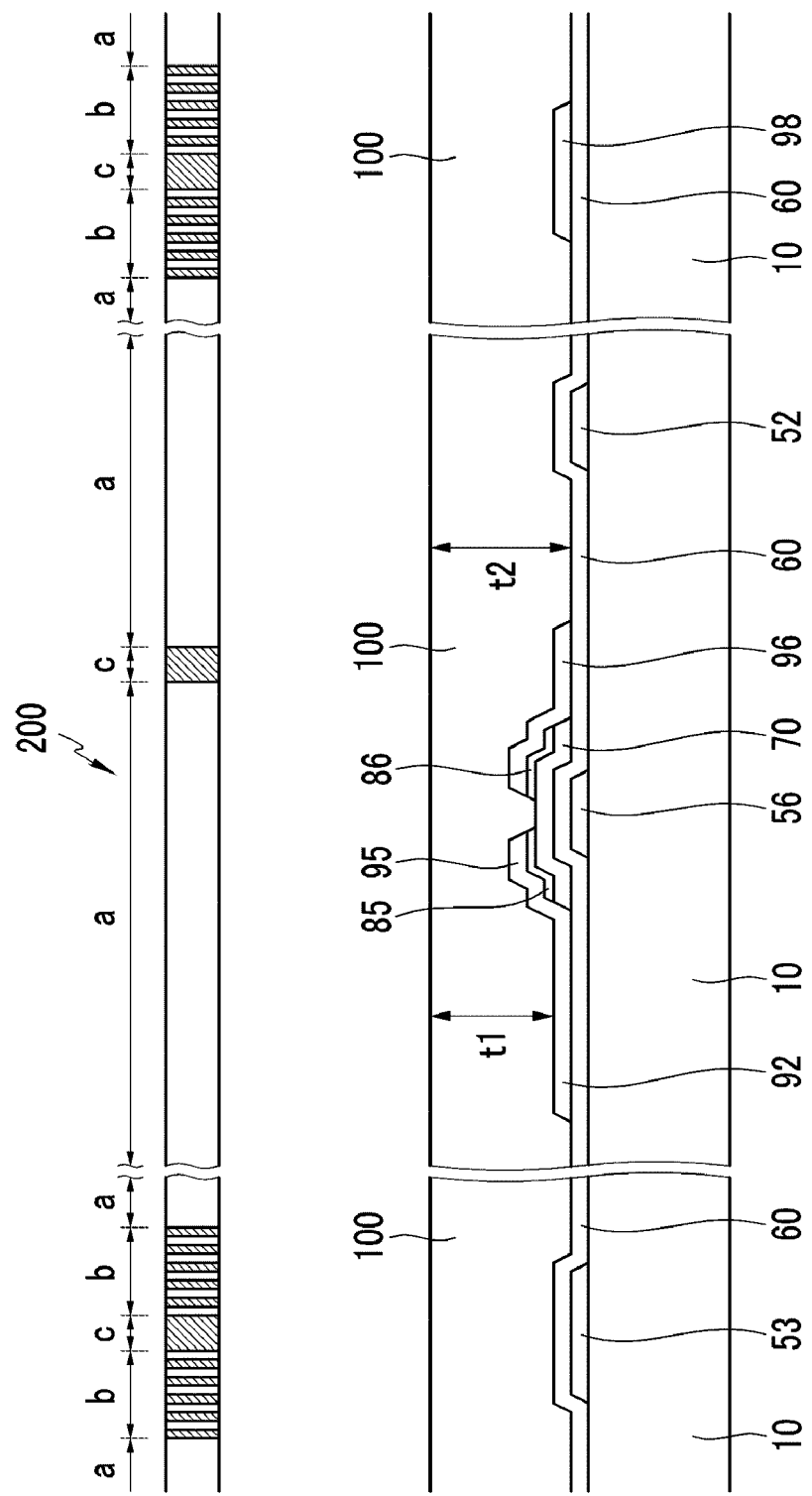
FIG. 3 to FIG. 5 are sectional views sequentially showing a manufacturing method of a thin film transistor display panel taken along the line II-II' in FIG. 1 of the pad area.

First, as shown in FIG. 3, a passivation layer 100 made of the organic layer from a composition that defines a negative photosensitive film (Nega-PR) is coated. Elsewhere on the panel, as shown in FIG. 3, the organic insulating layer 100 has the characteristic of a flat top surface such that the thickness t1 of the organic layer disposed on the data wire made of the data metal is thinner than the thickness t2 of the organic layer on the portion where the data wire does not exist. The passivation layer 100 can also be formed with a non-photosensitive organic film and an inorganic film such as SiNx or SiOx. Also, a flat laminated structure with an inorganic film and an organic insulating film can be formed. In the Nega-PR, some portions that receive light are not etched away while the other portions that do not receive light are etched away.

As shown in FIG. 3, a photolithography mask 200 to control the transmittance of the light is positioned over the passivation layer 100. The mask 200 has an "a" region where the light is fully transmitted, a "b" region where the light is partially transmitted, and a "c" region where the light is blocked. That is, the "a" region is formed as an empty space and thus correspondingly fully transmits the light, the "b" region is formed with slit or mosaic patterns and thus correspondingly controls the transmittance of the light, and the "c" region is formed with a metal pattern and thus fully blocks the transmittance of the light. Also, FIG. 3 clearly shows the positions corresponding to the regions "a", "b", and "c". That is, the region "a" is a region where the passivation layer 100 is not etched, the region "b" is a region where a portion of the passivation layer 100 is etched, that is, corresponding to the surrounding portion of the pads 53 and 98, and the region "c" is a region where the passivation layer 100 is completely etched, that is, corresponding to the contact holes 102, 106, and 108 respectively exposing the drain electrode 96 and the pads 53 and 98.

Here, the line width or the interval between the neighboring lines in the slit patterns, lattice patterns, or mosaic patterns that are arranged in the region "b" is less than the resolution of a light exposer.

Figure 4:
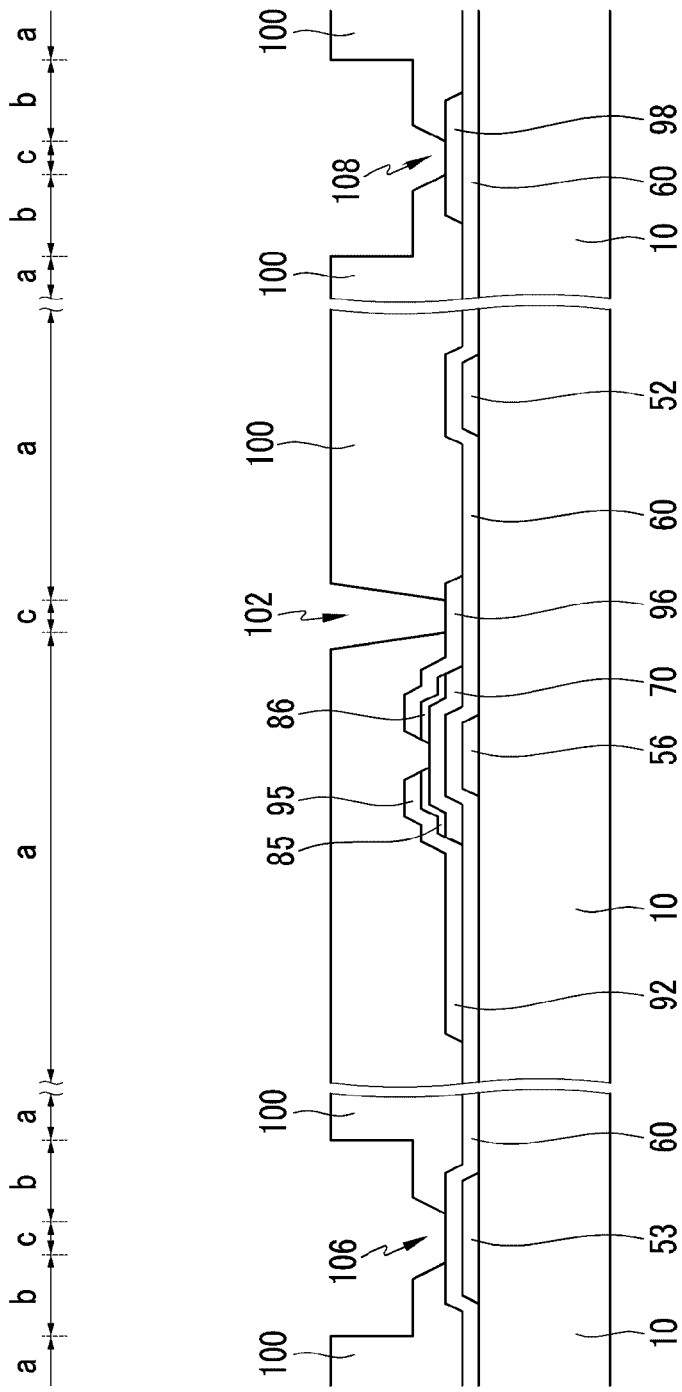

In succession, as shown in FIG. 4, by exposing the light to the upper parts of the passivation layer 100 and thus exposing and developing the Nega-PR, contact holes 102, 106, and 108 exposing the drain electrode 96 and the pads 53 and 98 are formed in the passivation layer 100. If the light is exposed to the passivation layer 100 through the mask, a polymer ingredient from the passivation layer 100 is not decomposed in the region "a" because the light is fully transmitted, while the region "c" correspondingly fully blocks the light, so the polymer ingredient from the passivation layer 100 is fully decomposed. The polymer ingredient from the passivation layer 100 is partially decomposed in the region "b" of slit or mosaic patterns because of a small amount of the exposed light. And then, followed by developing the passivation layer 100, the organic layer wherein the polymer ingredient from the passivation layer 100 is not decomposed (region "a") remains and the region "b" that is partially exposed has a greater thickness of the organic passivation layer than that of the region "c" where the light is not irradiated. It is important to control the developing time in order to not decompose all the polymer ingredient from the passivation layer 100.

Figure 5:
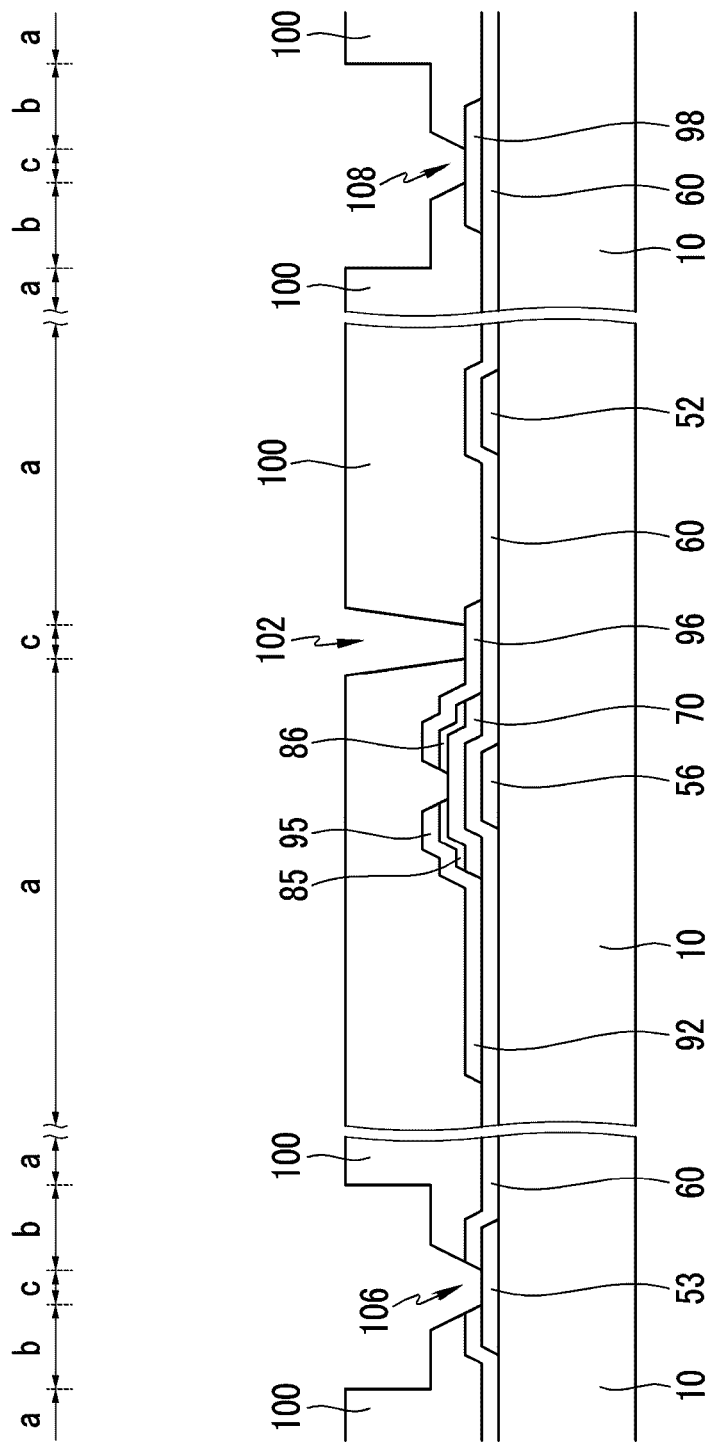

Next, as shown in FIG. 5, the gate insulating layer 60 is etched to form a contact hole 106 exposing the gate pad 53.

According to the embodiment, when the organic layer as the passivation layer 100 is made of a Nega-PR organic layer, the portion that receives the light remains as a pattern and the portion that does not receive the light is removed. Here, the photomask 200 has slit or mosaic patterns formed therein in the pad regions corresponding to the contact holes 102, 106, and 108 of the panel where the slit or mosaic patterns are formed with a Cr metal pattern and each photomask slit portion has a line width of less than the resolution of a light exposer such that patterning light is transmitted through the photomask and to the Nega-PR organic layer with varying degrees of intensity and thus the resulting post-etch height of the organic layer can be selectively controlled so as to provide reduced effective thickness in the pad regions of the contact holes 102, 106, and 108. In the Nega-PR, some portions that receive light are not etched away while other portions that do not receive light are etched away, which will be described with reference to FIG. 6 and FIG. 7.

Figure 6:
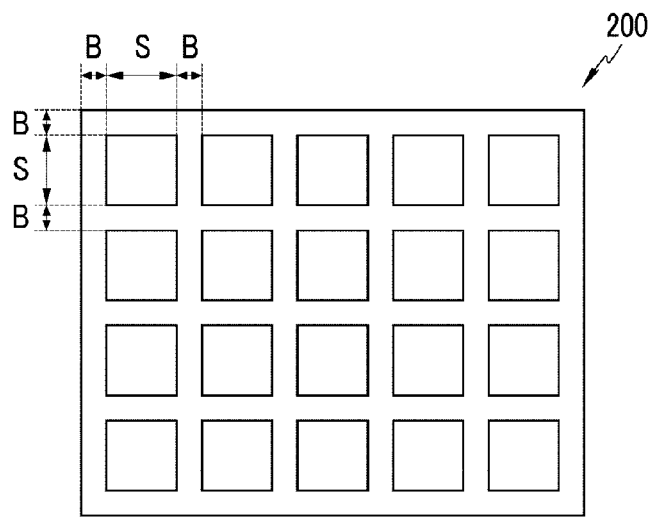
FIG. 6 and FIG. 7 are plan views of a mosaic-type mask corresponding to the pad area according to an embodiment of the present invention.
Figure 7:
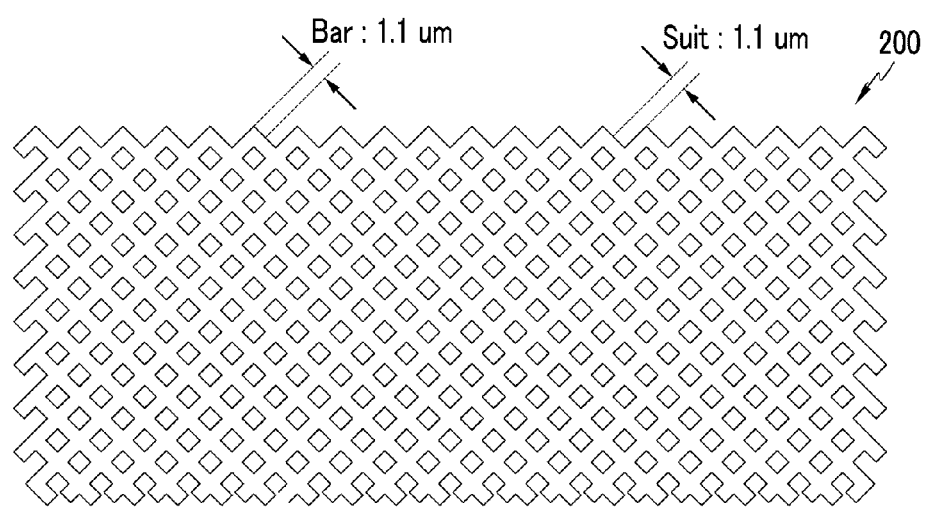

FIG. 6 and FIG. 7 are plan views of a mosaic-type mask corresponding to the pad area according to an embodiment of the present invention. Firstly, FIG. 6 is a plan view of the photomask having mosaic patterns that are parallel and perpendicular to data lines (or gate lines) according to an embodiment of the invention. Here, "B" means bar value, the line width in the metal pattern such as Cr indicates the portion where the metal is disposed on the mask, and "S" means slit value, and the metal pattern interval indicates the portion where the metal pattern is not disposed on the mask. Here, the line width of the metal pattern may range from 0.7 to 3.0 um, and the interval between metal patterns may range from 0.7 to 3.0 um. Also, FIG. 7 is a plan view of the photomask having mosaic patterns according to another embodiment of the invention. Here, the mosaic photomask is rotated about 45 degrees with respect to that of FIG. 6. In FIG. 7, differently from FIG. 6, the size of the "S" and "B" are the same, however it is not limited thereto.

Figure 8:
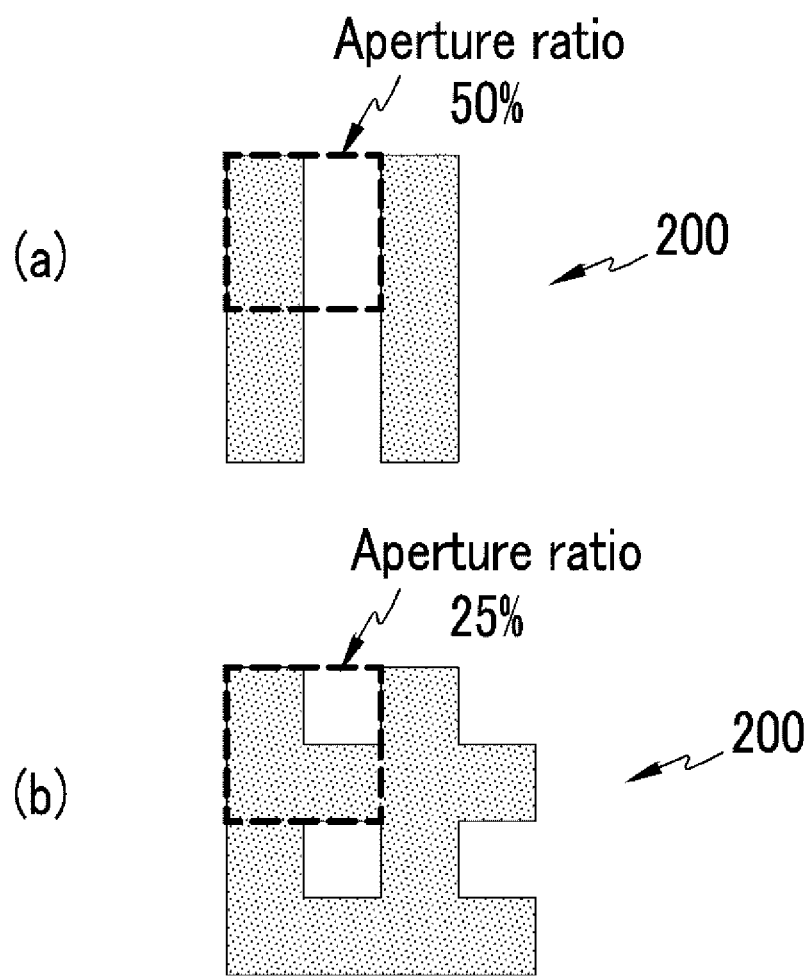
FIG. 8a is an enlarged view of a mosaic-type mask according to an embodiment of the present invention.
FIG. 8b is a partially enlarged view of a bar-type slit mask.

FIG. 8a shows a part of the mosaic slit photomask according to an embodiment of the invention, and FIG. 8b, for comparison, shows a part of the slits of the photomask that are only parallel to each other. In the Nega-PR type of organic insulating layer according to an embodiment of the invention, some portions that receive light are not etched away while other portions that do not receive light are etched away. Therefore, referring to FIG. 8, in the unit area represented by the dotted line, the line-type slit photomask (FIG. 8b) has a light-transmittance value of about 50%. So the remaining area that does not transmit the light undergoes decomposition of the polymer. However, in the mosaic slit photomask (FIG. 8a) according to an embodiment of the invention, in the same conditions, the light-transmittance value is only about 25%, and as a result the amount of transmitted light is reduced and the amount of light that does not decompose the polymer of the Nega-PR is reduced such that a greater amount of the polymer is decomposed and etched. Therefore, the height of the organic insulating layer in the pad region can be reduced more effectively.

As described above, the height of the passivation layer may be reduced as the transmittance (the aperture ratio) of the mask 200 is reduced, however it may be confirmed that the embossing pattern is clearly generated with reference to FIG. 8.

Figure 9:
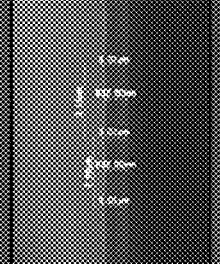
FIG. 9 is an experimental result of photolithographically forming patterns in a negative photosensitive organic layer depending on the various embodiments.

FIG. 9 shows the real experimental results of the various patterns that are exposed into the Nega-PR type of organic insulating layer through the mosaic pattern photomasks having various bar values, line widths of the metal pattern, slit values, and intervals between the metal patterns. Here, the initial thickness of the Nega-PR type organic insulating layer in the pixel region is 2.44 um. In FIG. 9, "Max" is the maximum height in the patterns of the passivation layer 100 patterned by the corresponding mask, "Min" is the minimum height thereof, "Avg" is the average height, "Range" is the difference between the maximum height and the minimum height, and the unit is micrometers. "Image" is a photograph of the upper portion of the passivation layer 100, "SEM(Tilt)" is a SEM photograph of the passivation layer 100 that is tilted by a predetermined angle from the side, and "SEM(Vertical)" is a SEM photograph of the side of the passivation layer 100.

In FIG. 9, an embodiment (referred to as the first embodiment) of B=1.3 and S=1.8, an embodiment (referred to as the second embodiment) of B=1.5 and S=2.0, and an embodiment (referred to as the third embodiment) are described. It is confirmed that the transmittance of the light and the average height Avg of the passivation layer 100 are decreased from the first embodiment to the third embodiment. However, the height deviation (the difference of the maximum height and the minimum height) of the passivation layer 100 is 0.08 in the first embodiment, but the height deviation is increased to 0.27 in the second embodiment and to 0.39 in the third embodiment. That is, it may be confirmed that when the aperture ratio is decreased, the whole height of the passivation layer 100 is decreased, however the unevenness is further clearly generated and this point is clearly seen in the photographs. Therefore, the low aperture ratio is always good and it is preferable that the mask is manufactured by controlling the aperture ratio according to the kind of passivation layer 100 and the kind of light source.

Also, as shown in the photograph of FIG. 9, it may be clearly confirmed that the pattern corresponding to the pattern of the mask is formed in the passivation layer 100. This pattern is formed corresponding to the lattice pattern, and the pattern of the mask has the lattice pattern of the predetermined intervals (S and B), however when the pads 53 and 98 are non-uniformly formed, the passivation layer 100 may not be formed with the desired height in the pad portion. This problem may be mainly generated in the case that the lines and the lattice pattern of the mask are perpendicular or parallel to each other as shown in FIG. 6, and when using the mask of the lattice pattern rotated by 45 degrees as shown in FIG. 7, the relationship between the interval of the pads and the sizes (B and S) of the lattice pattern of the mask is decreased. As a result, although the interval between the pads is non-uniform, a passivation layer having the uniform height may be formed by applying the embodiment of FIG. 7.

Figure 10:
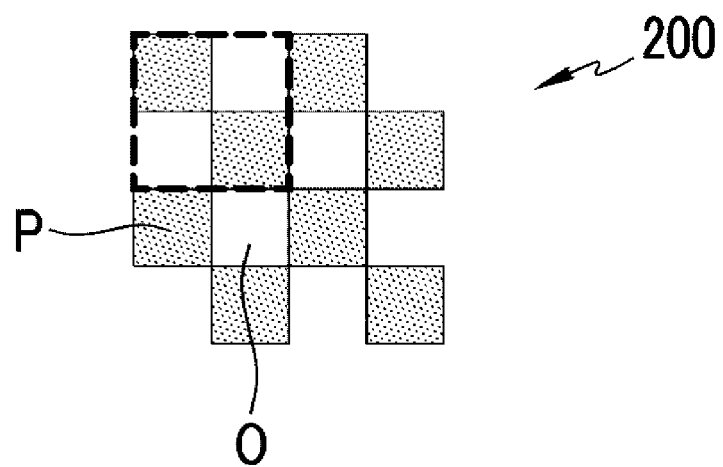
FIG. 10 is an enlarged top view of a mosaic-type mask according to another embodiment of the present invention.

FIG. 10 is an enlarged top view of a mosaic-type mask according to another embodiment of the present invention.

The pattern of the mask of FIG. 10 is the mosaic pattern such that the continuous lines are not formed in one direction like FIG. 6 and FIG. 7, but island metal patterns "P" are formed according to the vertical and the horizontal directions and are alternately arranged with an opening region. In FIG.

10, the island metal patterns "P" have the same size, however the island metal patterns "P" may have at least two sizes and may be repeatedly arranged according to an embodiment.

The aperture ratio of the mask of the mosaic pattern is 50% such that it has a higher aperture ratio than that of the masks of FIG. 6 and FIG. 7, and thereby the thickness of the passivation layer 100 is great, however the aperture ratio may be decreased by controlling the size of the island metal patterns, and when the mask has the same aperture ratio as that of FIG. 6 and FIG. 7, the mask may have improved merits as follows. That is, when the mask has the same aperture ratio, the number of repeats of the opening regions and the metal patterns is higher than that of FIG. 6 and FIG. 7 such that the number of uneven patterns formed in the passivation layer 100 is increased. If the number of uneven patterns is increased, a small height difference is generated when the passivation layer 100 is exposed by the same light amount. As a result, the height of the passivation layer 100 may be sufficiently decreased and the difference between the uneven patterns may be reduced.

Although the present invention has been explained by the embodiments shown in the drawings described above, it should be understood by the ordinarily skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of manufacturing a thin film transistor display panel, the method comprising:
    forming a wire throughout a display area and a pad portion on an insulating substrate;
    depositing a passivation layer covering the display area and the pad portion,
    exposing the passivation layer using a mask having a mesh pattern including a metal pattern formed in a direction perpendicular and a direction parallel to the wire in a region corresponding to the pad portion; and
    developing the passivation layer for the thickness of the pad portion to be thinner than the thickness of the display area.

2. The method of claim 1, wherein the surface of the passivation layer on the pad portion is formed with an uneven mosaic pattern.

3. The method of claim 2, wherein the passivation layer is made of a Nega-PR type of organic layer.

4. The method of claim 3, wherein a line width of the metal pattern in the area of the mask corresponding to the pad portion is in the range from 0.7 to 3.0 um.

5. The method of claim 4, wherein an interval between metal patterns in the area of the mask corresponding to the pad portion is in the range from 0.7 to 3.0 um.

6. The method of claim 1, wherein the passivation layer is made of a Nega-PR type of organic layer.

7. The method according to claim 6, wherein a line width of the metal pattern in the area of the mask corresponding to the pad portion is in the range from 0.7 to 3.0 um.

8. The method of claim 7, wherein an interval between metal patterns in the area of the mask corresponding to the pad portion is in the range from 0.7 to 3.0 um.

9. A method of manufacturing a thin film transistor display panel, the method comprising:
    forming a wire throughout a display area and a pad portion on an insulating substrate;
    depositing a passivation layer covering the display area and the pad portion;
    exposing the passivation layer by using a mask including a metal pattern tilted in a positive direction and a negative direction with respect to the wire by a predetermined angle; and
    developing the passivation layer for the thickness of the pad portion to be thinner than the thickness of the display area.

10. The method of claim 9, wherein the surface of the passivation layer on the pad portion is formed with an uneven mosaic pattern or a minute slit pattern tilted at the predetermined angle.

11. The method of claim 10, wherein the passivation layer is made of a Nega-PR type of organic layer.

12. The method of claim 11, wherein a line width of the metal pattern in the area of the mask corresponding to the pad portion is in the range from 0.7 to 3.0 um.

13. The method of claim 12, wherein an interval between the metal patterns in the area of the mask corresponding to the pad portion is in the range from 0.7 to 3.0 um.

14. The method of claim 13, wherein the predetermined angle is 45 degrees.

15. The method of claim 9, wherein the passivation layer is made of a Nega-PR type of organic layer.

16. The method of claim 15, wherein a line width of the metal pattern in the area of the mask corresponding to the pad portion is in the range from 0.7 to 3.0 um.

17. The method of claim 16, wherein an interval between the metal patterns in the area of the mask corresponding to the pad portion is in the range from 0.7 to 3.0 um.

18. The method of claim 17, wherein the predetermined angle is 45 degrees.

19. A method of manufacturing a thin film transistor display panel, the method comprising:
    forming a wire throughout a display area and a pad portion on an insulating substrate;
    depositing a passivation layer covering the display area and the pad portion,
    exposing the passivation layer by using a mask having a checker board pattern including an island metal pattern alternately formed in a first direction and a second direction with respect to the wire in a region corresponding to the pad portion; and
    developing the passivation layer for the thickness of the pad portion to be thinner than the thickness of the display area.

20. The method of claim 19, wherein the surface of the passivation layer on the pad portion is formed with an uneven mosaic pattern.

21. The method of claim 20, wherein the passivation layer is made of a Nega-PR type of organic layer.

22. The method according to claim 21, wherein a width of the island metal pattern in the area of the mask corresponding to the pad portion is in the range from 0.7 to 3.0 um.

23. The method according to claim 22, wherein an interval between the island metal patterns in the area of the mask corresponding to the pad portion is in the range from 0.7 to 3.0 um.

24. The method according to claim 23, wherein the first direction and the second direction are tilted in the positive direction or the negative direction with respect to the wire by 45 degrees.

* * * * *